US005728421A

United States Patent [19]

Gyorgy et al.

[11] Patent Number: 5,728,421

[45] Date of Patent: Mar. 17, 1998

[54] ARTICLE COMPRISING SPINEL-STRUCTURE MATERIAL ON A SUBSTRATE, AND METHOD OF MAKING THE ARTICLE

[75] Inventors: Ernst Michael Gyorgy, Madison; Julia Mae Phillips, Mountainside; Yuri Suzuki, Bridgewater; Robert Bruce van Dover, Maplewood; Suzanne Rachel Gyorgy, Chatham, all of N.J., executrix of said Ernst Michael Gyorgy, deceased

[73] Assignee: Lucent Technologies Inc., Murray Hill, N.J.

[21] Appl. No.: 697,402

[22] Filed: Aug. 23, 1996

Related U.S. Application Data

[63] Continuation-in-part of Ser. No. 406,084, Mar. 17, 1995, abandoned.

[51] Int. Cl.[6] .............................. B05D 5/12; C23C 16/40

[52] U.S. Cl. ...................... 427/126.3; 427/131; 427/225; 427/255.7

[58] Field of Search ................................ 427/126.3, 131, 427/258, 269, 419.2, 419.3, 255, 255.7; 428/212, 336, 701, 702

[56] References Cited

U.S. PATENT DOCUMENTS

| | | | |
|---|---|---|---|
| 3,996,095 | 12/1976 | Ahn et al. | 427/131 |
| 4,057,458 | 11/1977 | Maeda et al. | 156/603 |
| 4,477,319 | 10/1984 | Abe et al. | 204/56 R |
| 5,213,851 | 5/1993 | Snyder et al. | 427/576 |
| 5,478,653 | 12/1995 | Guenzer | 428/446 |
| 5,549,977 | 8/1996 | Jin et al. | 428/692 |

OTHER PUBLICATIONS

C.M. Williams et al., "The magnetic and structural properties of pulsed laser deposited epitaxial MnZn–ferrite films", *Applied Physics*, vol. 75(3), p. 1676 (1994).

D.T. Margulies et al., "Anisotropy In Epitaxial $Fe_3O_4$ and $NiFe_2O_4$ Thin Films", *Materials Research Society Symposium Proceedings*, vol. 341, p. 53 (1994).

C. Kittel, "Introduction to Solid State Physics", 2nd ed., Wiley & Sons (1956), p. 447.

G. Blasse, "Crystal Chemistry and Some Magnetic Properties of Mixed Metal Oxides with Spinel Structure" Philips Res. Reports Supplement, (1964), No. 3, Eindhoven.

"Structure and Magnetic Properties of Epitaxal Spinel Ferrite Thin Films", by Y. Suzuki et al., *Appl. Phys. Lett.*, vol. 68 (5), 29 Jan. 1996, pp. 714–716.

*Primary Examiner*—Shrive Beck
*Assistant Examiner*—Fred J. Parker
*Attorney, Agent, or Firm*—Eugen E. Pacher

[57] ABSTRACT

Ferrite films having excellent crystalline and magnetic properties are obtainable without high temperature (>500° C.) processing if an appropriate template layer is deposited on a conventional substrate body (e.g., $SrTiO_3$, cubic zirconia, Si), and the ferrite is deposited on the annealed template. The template is a spinel-structure metal oxide that has a lattice constant in the range 0.79–0.89 nm, preferably within about 0.015 nm of the lattice constant of the ferrite. Exemplarily, a $NiFe_2O_4$ film was deposited at 400° C. on a $CoCr_2O_4$ template which had been deposited on (100) $SrTiO_3$. The magnetization of the ferrite film at 4000 Oe was more than double the magnetization of a similarly deposited comparison ferrite film ($NiFe_2O_4$ on $SrTiO_3$), and was comparable to that of a $NiFe_2O_4$ film on $SrTiO_3$ that was annealed at 1000° C. The ability to produce ferrite films of good magnetic properties without high temperature treatment inter alia makes possible fabrication of on-board magnetic components (e.g., inductor) on Si chips designed for operation at relatively high frequencies, e.g., >10 MHz, even at about 100 MHz.

13 Claims, 2 Drawing Sheets

ARTICLE COMPRISING SPINEL-STRUCTURE MATERIAL ON A SUBSTRATE, AND METHOD OF MAKING THE ARTICLE

This application is a continuation-in-part of application Ser. No. 08/406,084, filed on Mar. 17, 1995, abandoned.

FIELD OF THE INVENTION

This invention pertains to articles (e.g., high frequency communication equipment, low power/high speed computers) that comprise a spinel-structure (s.s.) metal oxide (typically ferrite) layer on a substrate. Typically the article comprises a high frequency inductor, resonator, or other feature that requires the presence of a layer of high permeability/low conductivity ferrite.

BACKGROUND OF THE INVENTION

As is well known, conventional bulk ferrites (e.g., bulk (Ni,Zn) $Fe_2O_4$) are generally not useful for devices (e.g., inductors) that operate at frequencies above about 10 MHz. However, ferrites in thin film form are known to be potentially useful for high frequency applications (e.g., up to about 100 MHz and even higher).

Several vapor deposition techniques have been used to deposit s.s. ferrite (e.g., $NiFe_2O_4$, (Ni,Zn) $Fe_2O_4$) thin films on, e.g., MgO substrates. Among them are pulsed laser deposition, sputtering and e-beam reactive evaporation. See, for instance, C. M. Williams et al., *Applied Physics*, Vol. 75(3), p. 1676 (1994); and D. T. Margulies et al., *Materials Research Society Symposium Proceedings*, Vol. 341, p. 53 (1994).

Prior art vapor deposition methods of making ferrite films generally require growth (and/or annealing) at relatively high temperatures, e.g., 600°–800° C. Absent such high temperature treatment the films typically are of low crystalline and/or magnetic quality. However, such high temperature treatment is typically not compatible with conventional semiconductor processing methods. Furthermore, the high temperature treatment can lead to volatilization of constituents such as Zn or Mn (for instance, from (Mn, Zn) $Fe_2O_4$), and to, generally undesirable, chemical interaction of the film with the substrate.

In view of the potential importance of articles that comprise a vapor deposited s.s. ferrite (or other s.s. metal oxide) thin film on a substrate, it would be highly desirable to have available a method that enables growth of such films of high quality at a relatively low temperature. This application discloses such a method.

U.S. Pat. No. 4,477,319 discloses a process for forming a s.s. crystalline ferrite layer on the surface of a solid, whether metal or non-metal, by means of a chemical or electrochemical method in an aqueous solution without requiring heat treatment at a high temperature (300° C. or higher). Ferrite layers produced by the aqueous solution method of the above U.S. patent can generally not be formed as epitaxial layers, and typically are not of sufficient crystalline and/or magnetic quality to be of substantial interest for at least some applications, e.g., inductors in high frequency communication equipment.

By a "spinel-structure" (or "s.s.") ferrite or other metal oxide we mean herein a metal oxide that has the same crystal structure as spinel ($MgAl_2O_4$). For an illustration of the spinel structure see, for instance, C. Kittel, "Introduction to Solid State Physics", 2nd edition, Wiley & Sons (1956), p. 447. Compilations of metal oxides that have the spinel structure are readily available. See, for instance, G. Blasse, "Crystal Chemistry and Some Magnetic Properties of Mixed Metal Oxides with Spinel Structure," Philips Res. Reports Supplements, 1964 No. 3, Eindhoven, The Netherlands.

By a "vapor deposition" method of layer deposition we mean a physical vapor deposition method such as sputtering, laser deposition, e-beam reactive evaporation, or ion beam deposition or a chemical vapor deposition method such as CVD (chemical vapor deposition), MOCVD (metal organic CVD), plasma enhanced CVD, or LPCVD (low pressure CVD).

Of interest in this application are only vapor deposition methods, and aqueous solution deposition methods as exemplified by the '319 patent are not of interest, and are expressly excluded. Thus, any reference herein to "deposition", "growth" or "forming" (or equivalent terms) of a s.s. ferrite layer must be understood to refer to deposition, growth or forming of the s.s. ferrite layer by a (physical or chemical) vapor deposition process.

SUMMARY OF THE INVENTION

Broadly speaking, the invention is embodied in an improved method of making an article that comprises a layer of s.s. metal oxide, typically ferrite, and in the article made by the method.

More specifically, the method comprises providing a substrate, and depositing by vapor deposition a first s.s.metal oxide layer (typically of thickness less than about 1 μm) on the substrate. At least the portion of the substrate that is to be in contact with the s.s. metal oxide layer is selected to have cubic crystal symmetry, with a lattice constant in the range 0.79 nm to 0.89 nm (preferably within 0.015 nm of the lattice constant of the first s.s. metal oxide), and the first s.s. metal oxide layer is formed on the portion at a temperature of at most 500° C. The article is completed without heating the first s.s. metal oxide layer above 500° C. The first metal oxide layer can, but need not, consist of two or more s.s. metal oxide layers (typically ferrite layers) of different compositions.

In currently preferred embodiments of the invention the substrate comprises a substrate body that has a major surface, and typically does not have a lattice constant in the 0.79–0.89 nm range. Disposed on the major surface is a template layer that consists of material having cubic symmetry, with a lattice constant in the 0.79–0.89 nm range. The template layer typically is a s.s. metal oxide layer, possibly a ferrite layer, formed by vapor deposition, and the first s.s. metal oxide layer is formed on the template layer. Typically, but not necessarily, the first s.s. metal oxide layer is a ferrite layer. The template layer will frequently be less than 0.2 μm thick.

In another, less preferred embodiment, the substrate is selected to have cubic crystal symmetry, with a lattice constant in the 0.79–0.89 nm range, and the first s.s. metal oxide layer is formed directly on that substrate, without interposition of a template layer.

The composition of the template can, but need not, be different from the composition of the first s.s. metal oxide layer. The first s.s. metal oxide layer can, but need not, have essentially uniform composition throughout the layer thickness. Indeed, we contemplate articles that comprise two or more ferrite layers disposed on the template layer, the ferrite layers differing from each other with respect to composition and/or magnetic properties. The template layer can, but need not, be magnetic material.

Exemplarily, the substrate body is $SrTiO_3$ (STO), the template layer is $NiFe_2O_4$ grown at 600° C. and annealed at 1000° C. for 30 minutes in air, and the first s.s. metal oxide layer is also $NiFe_2O_4$, deposited at 400° C. and not annealed. Such a ferrite layer can have excellent magnetic properties, essentially the same as bulk $NiFe_2O_4$.

In a further exemplary embodiment the substrate body is STO, the template layer is $CoCr_2O_4$, and the first s.s. metal oxide layer is $CoFe_2O_4$, deposited at 400° C. The thus produced ferrite layer can be magnetically hard, with a square M-H loop and high coercive force. On the other hand, a similarly produced $Mn_{0.5}Zn_{0.5}Fe_2O_4$ layer or $NiFe_2O_4$ layer can be magnetically soft and have full bulk saturation magnetization.

More generally, among the ferrites contemplated for use in articles according to the invention are $Mn_xZn_yFe_zO_4$ and $Ni_xZn_yFe_zO_4$, with $0.15<x<0.75$, $0\leq y<0.6$, $1.5<z<2.5$, $x+y+z=3$, $CoFe_2O_4$ and $Ni_{x'}Fe_{y'}Cr_{z'}O_4$, with $0.5<x'<1.5$, $0.5<y'<1.5$, $0.5<z'<1.5$, $x'+y'+z'=3$.

DETAILED DESCRIPTION

Figure 1:
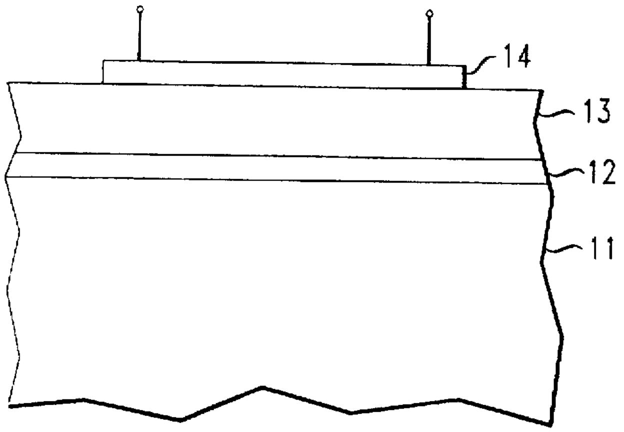
FIG. 1 schematically depicts a portion of an exemplary article according to the invention.

A significant aspect of the invention is the provision of a substrate that differs from prior art substrates inter alia with regard to lattice constant, as will now be discussed.

As demonstrated, for instance, by the cited references, MgO is a common prior art substrate material for vapor deposited s.s. ferrites such as $NiFe_2O_4$. Both of these materials have cubic crystal symmetry, with the former having a lattice constant of 0.4212 nm, and the latter of 0.8339 nm. The former clearly is fairly closely matched to the half-unit-cell dimension of the latter, and therefore is, by conventional criteria, a good substrate for the epitaxial growth of, e.g., $NiFe_2O_4$. However, we have found that a serious problem exists. The problem is most significant in the low temperature growth of magnetic metal oxide films, typically s.s. ferrite films, and will be described by reference to the low temperature growth of a film of a typical ferrite (namely, $NiFe_2O_4$) on a typical prior art substrate (namely, MgO). No limitation to this ferrite and/or substrate is implied.

In the early stage of low temperature (e.g., ≦500° C.) growth of $NiFe_2O_4$ on MgO, the spinel nucleates at various locations on the substrate, followed by growth of $NiFe_2O_4$ islands from the nuclei. If adjacent islands nucleated an odd number of MgO lattice constants apart then there will be a half-unit-cell intergrowth when the growing islands impinge on each other. This intergrowth typically leads to an extensive disordered region, exemplarily about 5 nm wide, that surrounds crystallites of typical lateral dimension 30 nm. In turn, we found that magnetic interaction between the crystallites and the surrounding disordered region generally leads to poor magnetic properties of the film, e.g., relatively low magnetization.

Film growth at temperatures above about 600° C. generally leads to less formation of disordered regions, and high temperature annealing of a low temperature fill generally results in substantial ordering of the disordered regions, with attendant improvement of the magnetic properties of the film.

Our analysis of the low temperature growth of s.s. ferrite films such as $NiFe_2O_4$ on MgO (and other prior art substrates such as STO, $Y_{0.15}Zr_{0.85}O_2$ (YSZ or cubic zirconia) and Si) has resulted in the realization that the conventionally used substrates are generally unable to support low temperature growth of s.s. ferrite films having technologically useful magnetic properties because of the disordered regions that form in consequence of the approximately 2:1 lattice constant ratio between s.s. ferrites and conventional substrates.

The above described problems can be greatly reduced or eliminated if at least the substrate region that is to be in contact with the s.s. ferrite (or possibly other s.s. metal oxide) layer is selected to have an approximately 1:1 lattice constant ratio with the layer. This can be achieved by selection of a substrate body that has cubic lattice symmetry and lattice constant approximately equal to that of the layer, typically in the range 0.79–0.89 nm. For instance, a ferrite film (e.g., $NiFe_2O_4$) can be formed on a s.s. metal oxide substrate such as $CoCr_2O_4$. Unfortunately, single crystal wafers of most s.s. metal oxides and of other, otherwise suitable, substrate materials, are not readily available, and thus it is generally not feasible to substitute such substrates for the conventionally used substrates. However, in principle, use of, for instance, a s.s. substrate body of appropriate lattice constant can support low temperature growth of high quality s.s. ferrite films.

We have solved the above discussed problem by provision of an appropriate template layer between a conventional substrate body and the s.s. metal oxide (typically ferrite) layer. See FIG. 1, wherein numerals 11–14 refer to the substrate body, template layer, s.s. ferrite film and patterned conductor, respectively. Currently preferred substrate bodies comprise such readily available materials as STO, YSZ and Si. Substrate bodies that comprise $Al_2O_3$, MgO Or $MgAl_2O_4$ are less preferred since they frequently exhibit diffusion of Mg and/or Al into the template layer at high temperatures.

We will next describe the growth of an exemplary template layer according to the invention ($CoCr_2O_4$) on (100) oriented STO, followed by crystal quality improving heat treatment above 500° C. and growth of an exemplary ferrite film ($NiFe_2O_4$) on the template layer. By a "crystal quality improving heat treatment" we mean herein a heat treatment for a length of time sufficient to result in crystal structure improvement, as determined, for instance, by Rutherford back-scattering spectroscopy (RBS).

A conventional (100)-oriented STO wafer was mounted in a conventional pulsed laser deposition system (KrF excimer laser, 248 nm wavelength). The atmosphere in the deposition chamber was set to 1 mTorr pressure (0.01 mTorr $O_2$, 0.99 mTorr $N_2$), and the wafer heated to 600° C. A $CoCr_2O_4$ target was laser ablated with 4 $J/cm^2$ pulses at 10 Hz repetition rate, resulting in a growth rate of about 100 nm/hr. After deposition of about 100 nm of $CoCrO_2$ and cooling of the substrate body/template layer combination, the template layer was annealed in conventional apparatus at 1000° C. in air for 30 minutes. The thus produced template layer had (100) orientation and exhibited excellent crystal quality, as determined by XRD (X-ray diffraction) ($\Delta\psi$=0.72° for (400) peak) and RBS (Rutherford backscattering spectroscopy); ($\chi_{min}$=14%).

Figure 2:
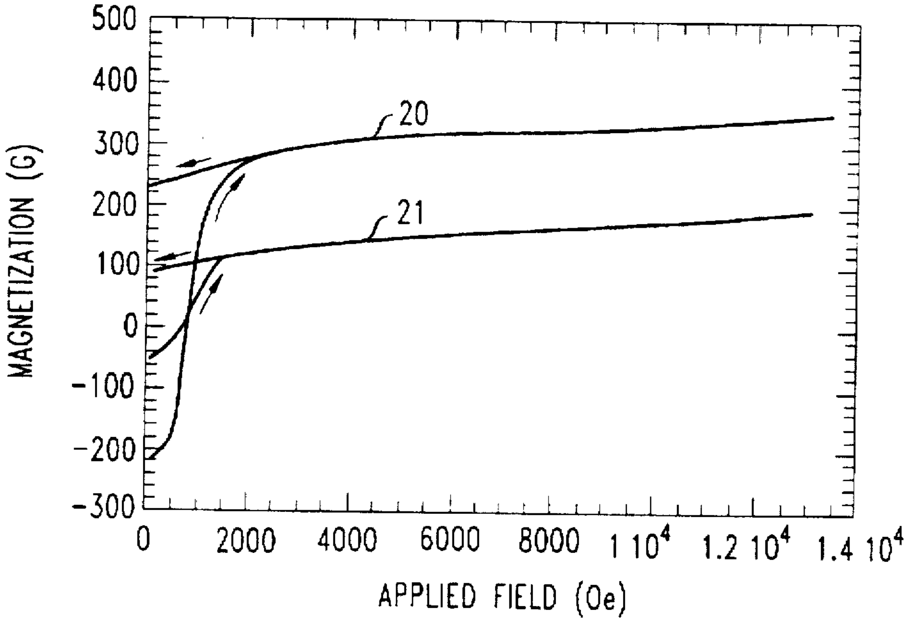
FIGS. 2–5 present magnetic data for some exemplary embodiments of the invention, together with comparison data.

Subsequently, a $NiFe_2O_4$ layer of approximate thickness 150 nm was deposited on the template layer substantially as described above, except that the substrate was maintained at 400° C. and the atmosphere was 1 mTorr $O_2$. After completion of deposition and cool-down, the ferrite ($NiFe_2O_4$) layer was characterized by XRD, RBS and magnetization measurements. The former measurements showed that the crystal quality of the ferrite film was substantially as good as that of the template layer ($\Delta\omega$ and $\chi_{min}$ of the ferrite film only slightly larger than those of the template). The latter measurements (carried out with a conventional vibrating sample magnetometer) showed that the room temperature magnetization M(H) of the ferrite film according to the invention was comparable to that of a prior art $NiFe_2O_4$ film deposited on STO and annealed at 1000° C. Exemplary results are shown in FIG. 2, wherein curves 20 and 21 are, respectively, for a film according to the invention and a comparison film deposited under essentially the same conditions directly on a STO substrate body. As can be readily seen from FIG. 2, the ferrite film made according to the invention has significantly higher magnetization than the comparison film, demonstrating the considerable improvement in magnetic properties that can be achieved by the use of an appropriate template layer, annealed at a temperature above 500° C. for a time sufficient for crystal quality improvement.

TABLE I

| template | orientation on (100) STO | $\Delta\omega$(°) | $\chi_{min}$(%) | lattice constant (nm) |
|---|---|---|---|---|
| $CoCr_2O_4$ | (400) | 0.72 | 14 | 0.838 |
| $Mg_2TiO_4$ | (400) | 0.39 | 30 | 0.845 |
| $FeGa_2O_4$ | (220) | 2.65 | | |
| $NiMn_2O_4$ | (400) | 0.5 | | 0.845 |

TABLE II

| template | orientation on (100) YSZ | $\Delta\omega$(°) | $\chi_{min}$(%) | lattice constant (nm) |
|---|---|---|---|---|
| $CoCr_2O_4$ | (111) | 0.56 | 9 | 0.838 |
| $Mg_2TiO_4$ | (111) | 0.71 | | 0.845 |
| $NiMn_2O_4$ | (111) | 0.26 | 9 | 0.845 |

Tables I and II summarize $\Delta\omega$ and $\chi_{min}$ results for exemplary template layers produced, respectively, substantially as described above on (100) STO and (100) YSZ, except that the layers other than $CoCr_2O_4$ on STO were grown in 1 mTorr $O_2$. As dan be seen from the Tables, $CoCr_2O_4$, $NiMn_2O_4$ and $Mg_2TiO_4$ form (111)-oriented layers on (100) YSZ. $FeGa_2O_4$ does not have a stable crystalline phase on (100) YSZ under the recited conditions, and forms a (110) -oriented layer on (100) STO.

Of the four metal oxides of the tables, $CoCr_2O_4$ and $NiMn_2O_4$ yielded layers of excellent crystallinity on (100) STO and (100) YSZ and are preferred. Other possible, but currently non-preferred s.s. metal oxides are $MgCr_2O_4$, $MgTi_2O_4$, $MnAl_2O_4$ and $CuMn_2O_4$.

Figure 3:
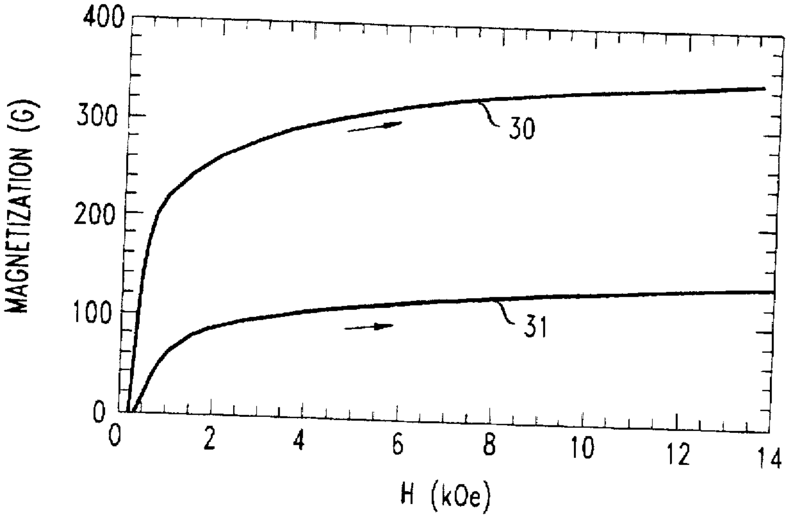

FIG. 3 shows the magnetization (30) of a $NiFe_2O_4$ ferrite layer according to the invention (sputter deposited at 400° C., no subsequent heat treatment above that temperature), deposited on a $NiFe_2O_4$ template layer (sputter deposited at 600° C., annealed 30 minutes at 1000° C.), which in turn was deposited on a conventional (100) STO substrate body. The magnetization due to the template layer has been subtracted from the total measured magnetization, to yield the values of curve 30.

For comparison purposes, FIG. 3 also shows the magnetization of a prior art $NiFe_2O_4$ film (sputter deposited at 600° C. on STO). Clearly, the ferrite film according to the invention has substantially higher magnetization than the prior art film.

Figure 4:
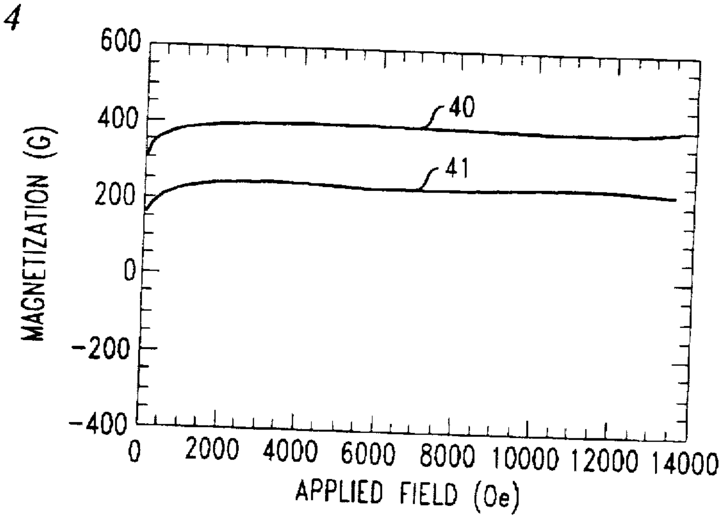

Similar data are shown in FIG. 4, wherein curve 40 pertains to a substrate/template/ferrite combination according to the invention (STO substrate, $CoCr_2O_4$ template, $Mn_{1-x}Zn_xFe_2O_4$, ferrite layer, with x~0.5, grown at 400° C. by pulsed laser deposition), and curve 41 pertains to a prior art comparison layer ($Mn_{1-x}Zn_xFe_2O_4$ on STO, x~0.5). Again, the layer according to the invention has substantially higher magnetization.

Figure 5:
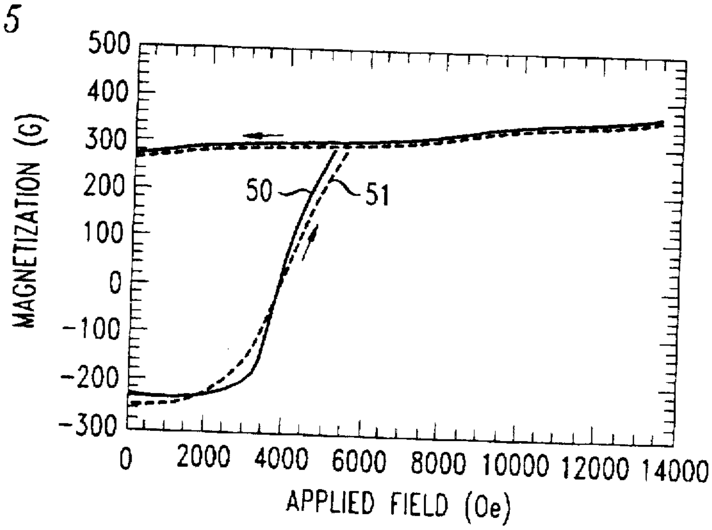

FIG. 5 shows the magnetization of an exemplary "hard" magnetic material ($CoFe_2O_4$) according to the invention (50), and of the corresponding prior art material (51). Curve 50 shows an improved (i.e., more square) M-H loop.

In preferred embodiments the template material is selected such that most (i.e., >50%, desirably ≥ 75%) of the lattice mismatch between the substrate body and the first oxide layer is taken up at the substrate/template interface. By this we mean that $|2a_s-a_t|>|a_t-a_f|$, where $a_s$, $a_t$ and $a_f$ are the lattice constants of the substrate body, the template material and the first oxide, respectively. It will be appreciated that in general $a_t$ is intermediate $a_f$ and $2a_s$. It will also be appreciated that the above inequality applies to the typical embodiment wherein the substrate body is a conventional material such as STO, YSZ or Si, but does not apply to the embodiment wherein the substrate is a s.s. oxide of lattice constant in the range 0.79–0.89 nm.

After formation of the layer combination according to the invention, conventional techniques will typically be used to form an electrical component or device that comprises the first oxide layer. Exemplarily, a patterned conductor (e.g., Al) is formed on the ferrite layer according to the invention, the combination providing an inductor that is suitable for operation at frequencies as high as 100 MHz or even 1 GHz. Among exemplary articles according to the invention are integrated circuits with on-board components that comprise a ferrite layer according to the invention, and circuits formed on a substrate other than Si and then flip-chip attached to Si-ICs.

The invention claimed is:

1. Method of making an article that comprises a first spinel-structure metal oxide layer, the method comprising a) providing a substrate body having a lattice constant $a_s$ and a major surface;

b) forming by vapor deposition a template layer on the major surface, the template layer being a second spinel-structure metal oxide layer selected to have a lattice constant $a_t$ in the range 0.79–0.89 nm, and heat treating the template layer at a temperature above 500° C. for a time sufficient for crystal quality improvement;

c) forming by vapor deposition the first spinel-structure metal oxide layer on the heat treated template layer at a forming temperature of at most 500° C., the first spinel-structure metal oxide layer comprising a spinel-structure metal oxide having a lattice constant $a_f$; and d) completing the article without heating the first spinel-structure metal oxide layer above 500° C.

2. Method of claim 1, wherein the template layer is selected such that $|a_f-a_t|\leq 0.015$ nm.

3. Method of claim 1, wherein the substrate body and the template layer are selected such that $|2a_s-a_t|>|a_t-a_f|$.

4. Method of claim 1, wherein the substrate body is selected from the group consisting of $SrTiO_3$, cubic zirconia, Si, $MgAl_2O_4$, $MgAlGaO_4$, MgO and $Al_2O_3$.

5. Method of claim 4, wherein the template layer is selected from the group consisting of $CoCr_2O_4$ and $NiMn_2O_4$.

6. Method according to claim 4, wherein the first spinel-structure metal oxide layer comprises a material selected from the group consisting of $Mn_xZn_yFe_zO_4$, $Ni_xZn_yFe_zO_4$, with $0\leq y<0.6, 1.5<z\leq 2.5$, $x+y+z=3$, $CoFe_2O_4$ and $Ni_{x'}Fe_{y'}Cr_{z'}O_4$, with $0.5<x'<1.5, 0.5<y'<1.5, 0.5<z'<1.5$, $x'+y'+z'=3$.

7. Method of claim 1, wherein the first spinel-structure metal oxide layer comprises at least two spinel-structure metal oxide layers.

8. Method according to claim 1, wherein the first spinel-structure metal oxide layer comprises at least one ferrite layer, and step d) comprises forming a patterned conductor on said ferrite layer.

9. Method of claim 1, wherein the first spinel-structure metal oxide layer comprises a ferrite layer, and wherein the template layer comprises a non-ferrite metal oxide layer.

10. Method of claim 1, wherein both the first spinel-structure metal oxide layer and the template layer are ferrite layers.

11. Method of claim 10, wherein the template layer has essentially the same composition as the first spinel-structure metal oxide layer.

12. Method of claim 1, wherein either of the template layer and the first spinel structure metal oxide layer is formed by a physical vapor deposition method or a chemical vapor deposition method.

13. Method of claim 1, wherein the temperature above the forming temperature is about 1000° C.

* * * * *